United States Patent [19]
Jackson et al.

[11] Patent Number: 6,139,243
[45] Date of Patent: *Oct. 31, 2000

[54] METHOD AND SYSTEM FOR FLIPPING A TRAY OF PARTS

[75] Inventors: Robert L. Jackson, Moorpark; Russell E. Dudley, Simi Valley; David A. Noblett, Agoura, all of Calif.

[73] Assignee: Systemation Engineering, New Berlin, Wis.

[ * ] Notice: This patent issued on a continued prosecution application filed under 37 CFR 1.53(d), and is subject to the twenty year patent term provisions of 35 U.S.C. 154(a)(2).

[21] Appl. No.: 08/891,862

[22] Filed: Jul. 9, 1997

[51] Int. Cl.$^7$ ..................................... B65G 47/00
[52] U.S. Cl. .................. 414/405; 414/419; 414/811; 414/816; 414/762; 198/403
[58] Field of Search .................................. 414/403, 404, 414/405, 415, 418, 421, 419, 761, 762, 765, 811, 810, 816; 53/246, 392; 206/332, 334; 198/412, 403

[56] References Cited

U.S. PATENT DOCUMENTS 3,934,733   1/1976   Worder ..................... 414/405
4,344,730   8/1982   Dvorak ..................... 414/405
4,880,101   11/1989  Wiggins ................. 414/405 X
4,944,651   7/1990   Bogar ................... 414/405 X
5,360,309   11/1994  Ishiguro ................ 414/405 X
5,374,158   12/1994  Tessier et al. .
5,492,223   2/1996   Boardman et al. .

FOREIGN PATENT DOCUMENTS 146370    11/1979   Japan ...................... 414/415
1537459   1/1990    U.S.S.R. ................. 414/405

Primary Examiner—Frank F. Werner
Attorney, Agent, or Firm—Michael Best & Friedrich LLP

[57] ABSTRACT

A method and system are provided for flipping a tray of parts such as integrated circuit packages including a pair of flippable storage trays. A first storage tray has an upper surface which forms a grid of storage compartments wherein each of the storage compartments is adapted to hold a single integrated circuit package. Initially, the first tray is received at a flip station from a first part processing station. Then, the first and second trays are joined together so that they mate. Then, the mated first and second trays are inverted so that the packages are held in the second tray. Then, the first and second trays are separated and the second tray which now holds the plurality of packages is transferred to a second part processing station. Then, the cycle is repeated with a third tray of parts and the now empty first tray.

11 Claims, 5 Drawing Sheets

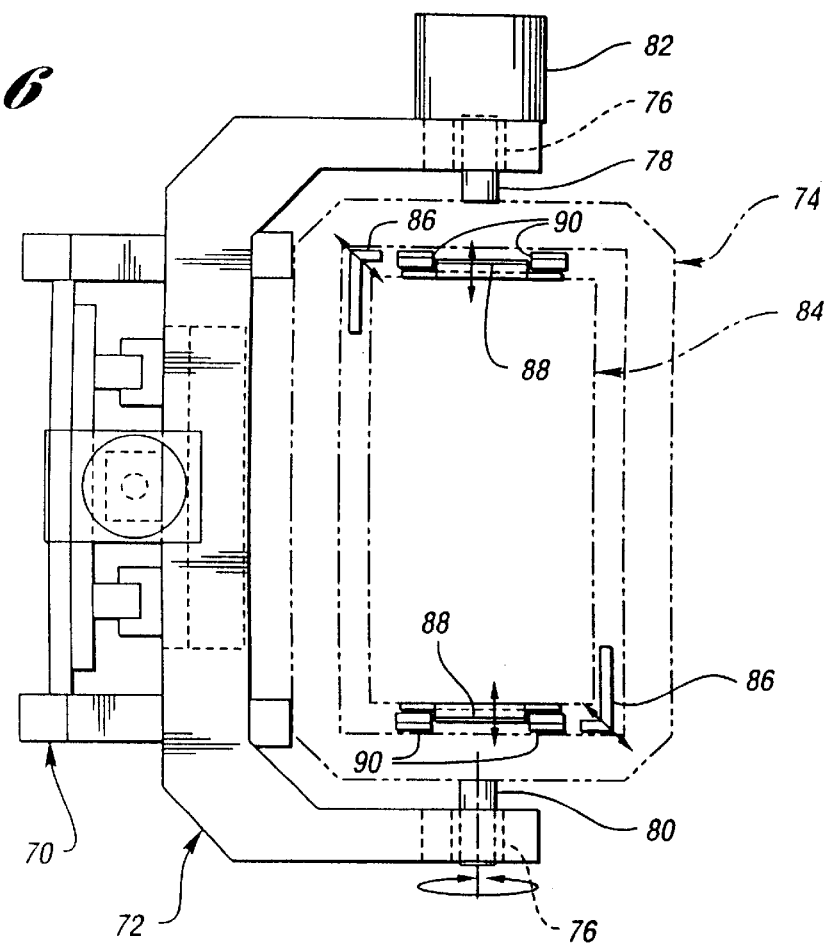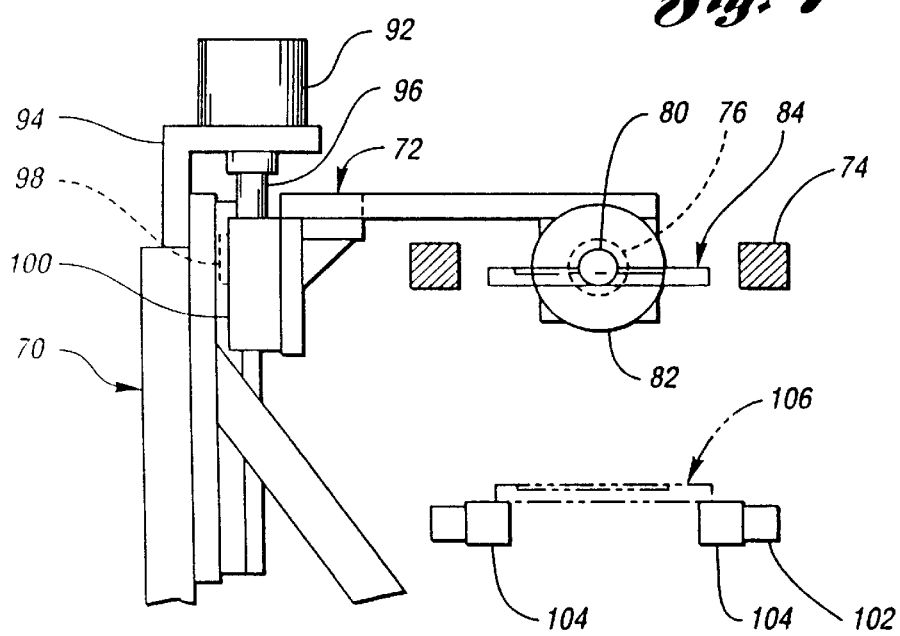

METHOD AND SYSTEM FOR FLIPPING A TRAY OF PARTS

TECHNICAL FIELD

This invention relates to methods and systems for automatically processing trays of parts and, in particular, to methods and systems for flipping trays of parts such as integrated circuit packages.

BACKGROUND ART

Packaged semiconductor components (i.e., integrated circuit packages) typically are handled in trays as they near completion of their manufacture. Typically, these trays do not permit processing from below because the parts are held by gravity (fixtured) from below the parts. However, the parts are visible and accessible from above the tray. Some processing typically must be performed on the top side of the part while other processing is necessary on the bottom side of the part. This problem has been partially solved by the creation of "flippable" trays (i.e. trays which can hold the top of the part one way or the bottom of the part when flipped the other way) as shown in U.S. Pat. No. 5,492,223.

U.S. Pat. No. 5,374,158 discloses a method and system for flipping individual computer chips at a time and processing the individual chips. This method is undesirable as it requires the individual handling of each chip and is comparatively slow.

Stand-alone systems for flipping a stack of trays are well known. However, such a stack flipper is a stand-alone flipper and is not integrated into a line or process.

SUMMARY OF THE INVENTION

An object of the present invention is to provide a method and system for flipping a tray of parts such as integrated circuit packages in order to process the other side of the components.

Another object of the present invention is to provide a method and system for flipping a tray of parts such as integrated circuit packages in order to automate the processes involved in completing the manufacture of these components (top and bottom side inspection, marking, repackaging for shipment, etc.).

In carrying out the above objects and other objects of the present invention, a method is provided for flipping a tray of parts. The method includes the steps of receiving at a flip station a first tray, which holds a plurality of parts, from a first part processing station, joining a second tray with the first tray so that the first and second trays mate, and inverting the mated first and second trays together so that the parts are also inverted and held in the second tray. The method also includes the steps of separating the mated first and second trays, and transferring the second tray which holds the plurality of parts from the flip station to a second part processing station.

Preferably, the method further includes the steps of clamping the mated first and second trays together and then unclamping the clamped first and second trays.

Also, preferably, the parts are integrated circuit packages and the first and second trays are flippable storage trays. Each of the trays has an upper surface which forms a grid of storage compartments and each of the storage compartments is adapted to hold a single integrated circuit package.

Still, preferably, the method further includes the steps of receiving at the flip station a third tray which holds a second plurality of parts from the first part processing station, joining the first tray with the third tray so that the first and third trays mate, and inverting the mated first and third trays together so that the second plurality of parts are also inverted and held in the first tray. The method also includes the steps of separating the mated first and third trays, and transferring the first tray which holds the second plurality of parts from the flip station to the second part processing station.

The method may also include the step of vibrating the integrated circuit packages so that each integrated circuit package is properly positioned within its corresponding storage compartment after the step of inverting.

Also, preferably, the step of inverting includes the step of rotating the mated first and second trays through an angle of approximately 180°.

A system is also preferably provided for carrying each of the method steps.

The system is typically a part of a larger system where other operations will be performed. The system has the following features:

1. Is able to accept a tray of parts from the process prior to it and releases the resulting inverted tray of parts to a process following it.
2. Is able to invert the tray without spilling or otherwise damaging the parts.
3. Is able to accept trays with the parts facing down or the parts facing up and inverts them.
4. Is able to perform this flipping on standard trays and may be changed over with minimal effort to accommodate different sized trays.
5. Assuming that the flip will be accomplished by using just one other tray, the system does not require more than 1 extra tray.
6. Flips the tray such that the front of the tray remains the front of the tray after the flip.

Prior to beginning the method of the present invention, an empty tray is inserted into a "top" tray cavity of the system. When the system is running, a tray with parts is received into the flip station via a conveyor or other transport means. The tray is further brought into the flip station until a stop point is reached. Then, the tray with parts is brought together or joined with the "top" tray and mated. The top and bottom trays are then clamped together. This clamped assembly (i.e., the top and bottom trays) is rotated vertically 180° so that the parts are now held by gravity in what previously was the "top" tray. The parts are now also inverted from how they had come into the flip station. The clamping mechanism is then relaxed and the upper tray is separated from the lower tray. The lower tray (i.e. previously the "upper" tray) is finally transported out to the following process and the tray that remains in the flip station may be flipped in preparation for the next tray.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 6 is a top plan view of a second embodiment of the system with a rotating mechanism and a tray illustrated by phantom lines;

FIG. 7 is an end view, partially broken away and in cross-section, of the system of FIG. 6 including a conveyor and a tray conveyed thereon illustrated by phantom lines.

BEST MODE FOR CARRYING OUT THE INVENTION

Figure 1:
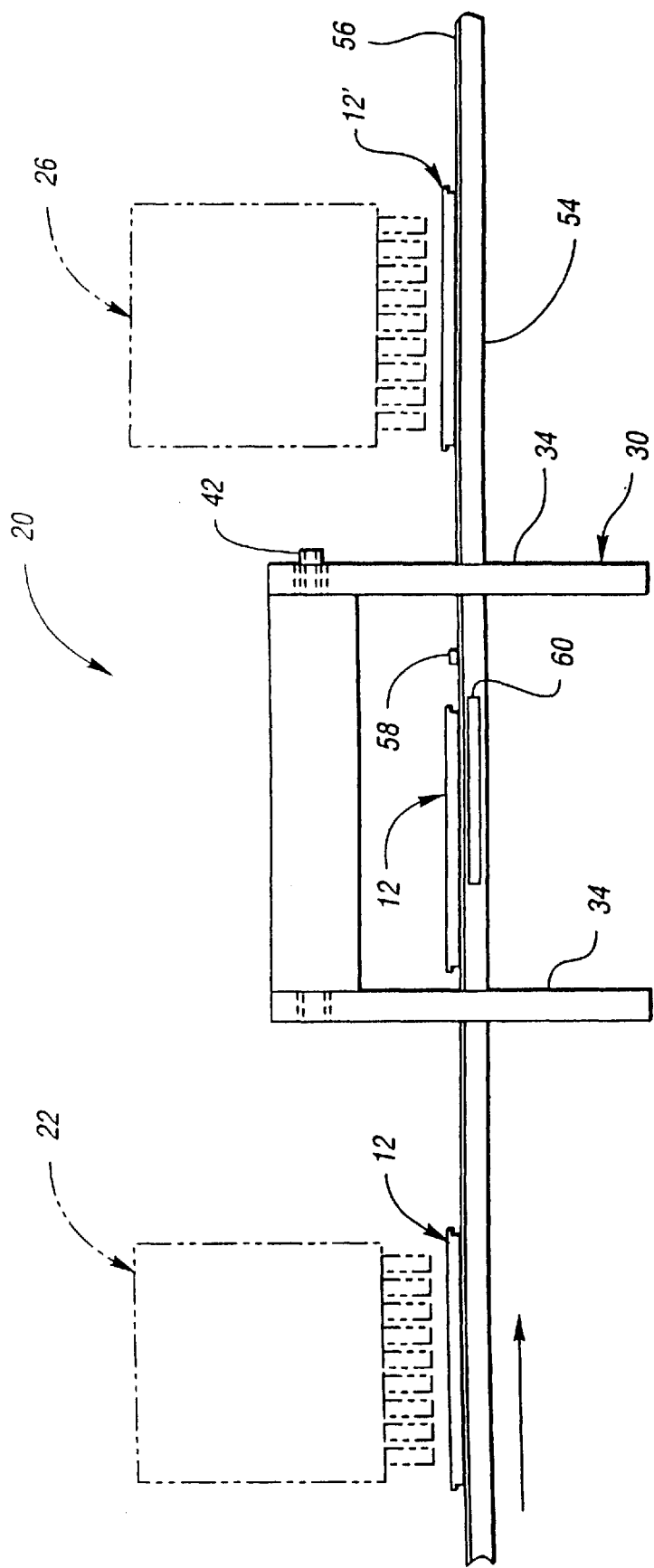
FIG. 1 is a schematic diagram illustrating the method and system of the present invention.
Figure 2:
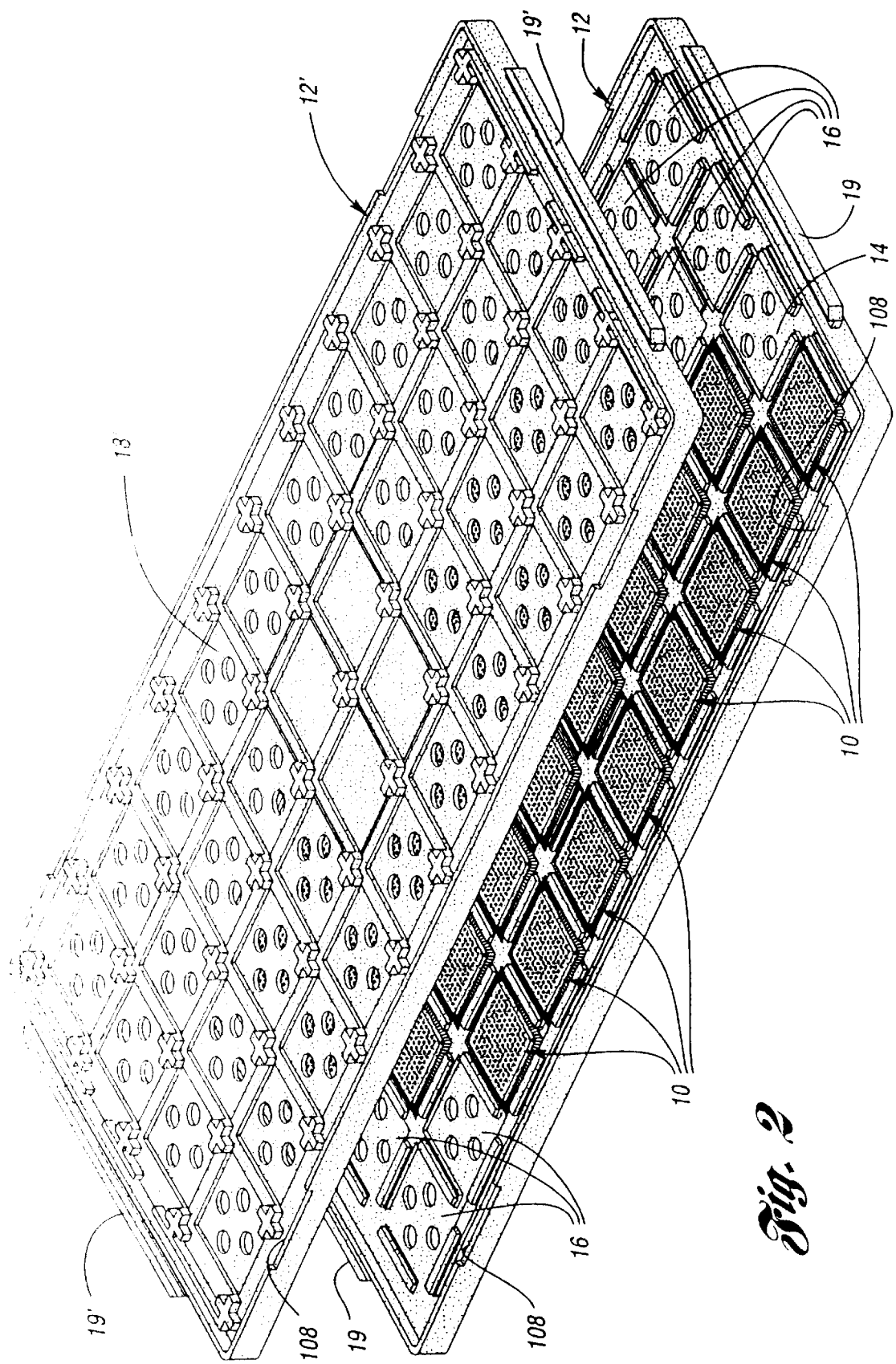
FIG. 2 is a perspective view of a pair of separated trays with a lower tray populated with integrated circuit packages such as QFP or BGA.
Figure 3:
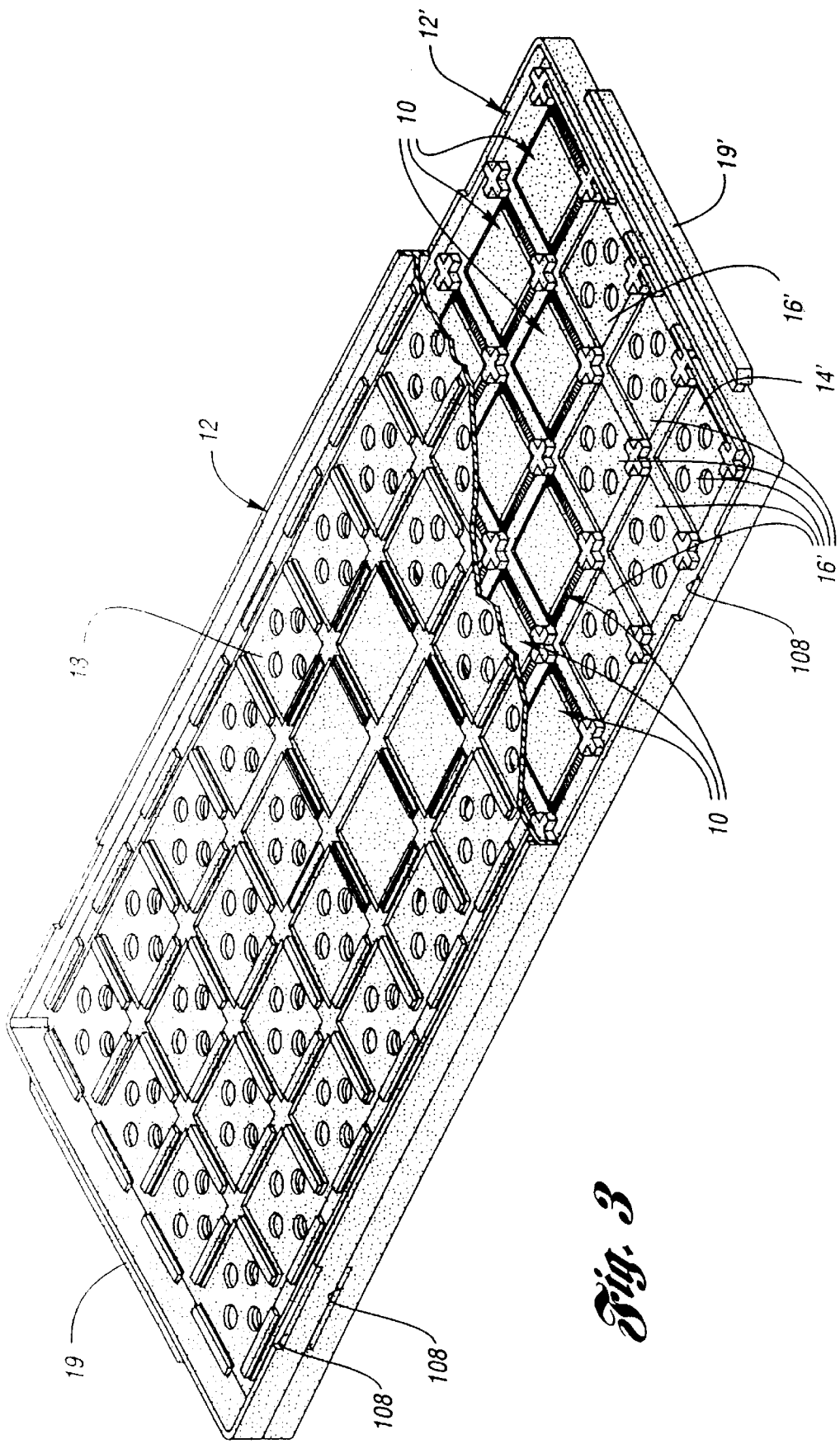
FIG. 3 is a perspective view, partially broken away, of the trays of FIG. 2 after they have been mated and inverted.

Referring now to the drawing Figures, there is illustrated in FIG. 1 a schematic diagram illustrating a method and system for flipping a tray of parts such as integrated circuit packages, generally indicated at 10 in FIG. 2. The packages 10 are held in a flippable tray, two of which are generally indicated at 12 and 12' in FIGS. 2 and 3. Each of the trays 12 and 12' has an upper surface 14 and 14', respectively, which forms a grid of storage compartments 16 and 16', respectively. Each of the storage compartments 16 and 16' is adapted to hold a single integrated circuit package 10. Each of the trays 12 and 12', respectively, has a lower surface 18 and 18', respectively, which may also form a grid of storage compartments. Each of the storage compartments in the lower surfaces 18 and 18' is also adapted to hold a single integrated circuit package. Each of the trays 12 and 12' includes rim portions 19 and 19', respectively, which are located at opposite ends of the tray 12 and 12'. Tray notches 108 are formed in side walls of the trays 12 and 12'. The trays 12 and 12' are held at the notches when separating (i.e., singulating) the trays 12 and 12'.

Referring again to FIG. 1, in general, the method of the present invention includes the steps of receiving at a flip station 20 the tray 12 which holds the integrated circuit packages 10 from a first part processing station 22.

Then, the second tray 12' is joined with the first tray 12 so that the first and second trays 12 and 12', respectively, mate.

Then, the mated first and second trays 12 and 12', respectively, are inverted together so that the packages 10 are also inverted and held in the second tray 12'.

Then, the second tray 12', which now holds the packages 10, is transferred from the flip station 20 to a second part processing station 26.

To ensure that the packages 10 are properly positioned in their corresponding storage compartments in the second tray 24, the method may also include the step of vibrating the integrated circuit packages 10 after the step of inverting at the flip station 20.

Figure 4:
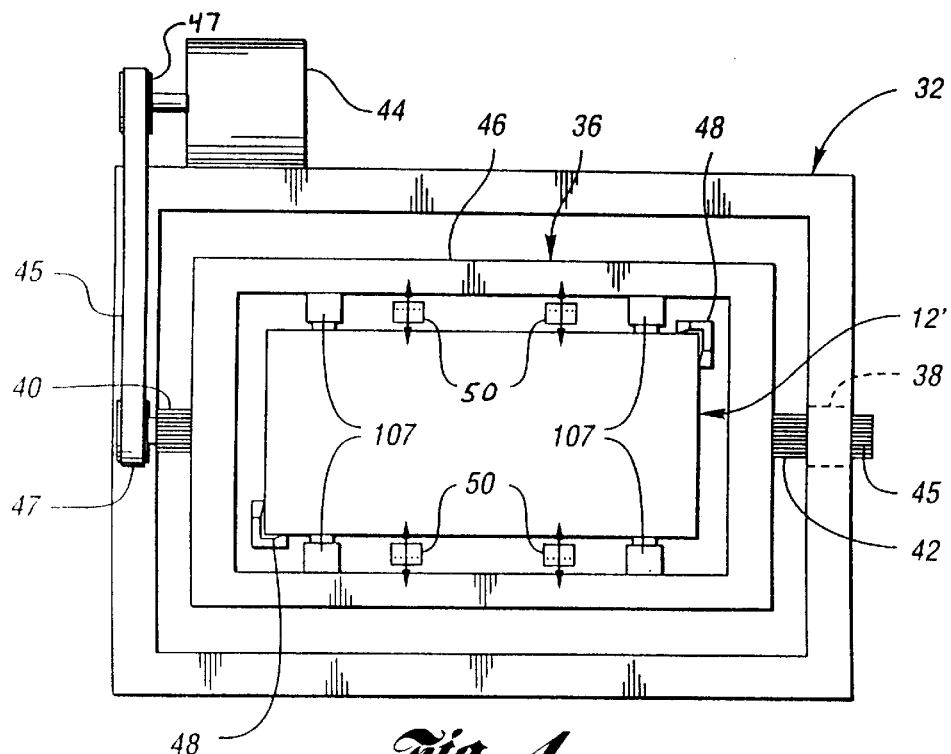
FIG. 4 is a top plan view of a tray and mounting and rotating mechanisms of a first embodiment of the system.
Figure 5:
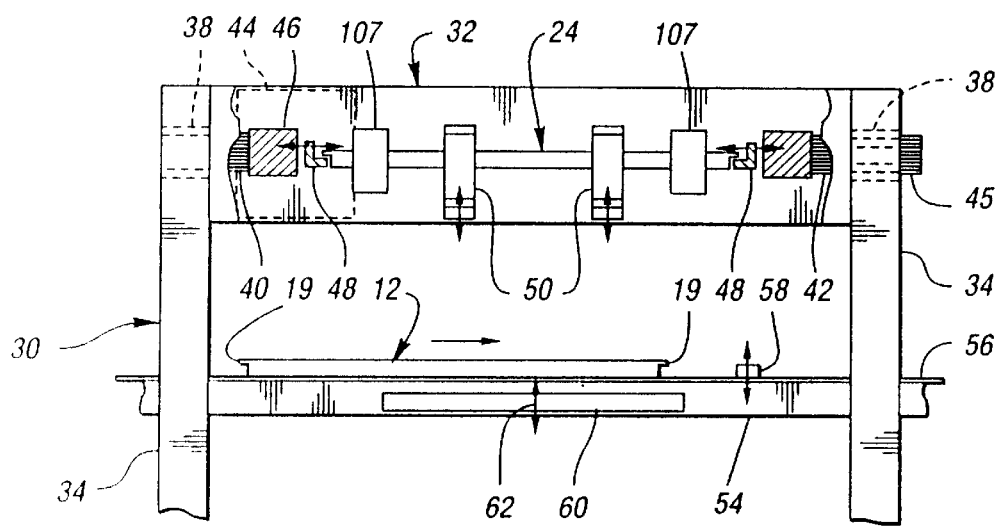
FIG. 5 is a side elevational view, partially broken away and in cross-section, of the system of FIG. 4 including a conveyor and tray conveyed thereon.

Referring now to FIGS. 4 and 5, there is illustrated a first embodiment of a system for flipping a tray of parts of the present invention. The system includes a main fixed mounting frame or a frame structure, generally indicated at 30, including a rectangularly-shaped frame 32 and legs 34 which extend downwardly from the frame 32 to support the frame 32 at its corners.

A rotating platform, generally indicated at 36, is rotatably supported on the frame 32 by a pair of rotation bearings 38 mounted on opposing sides of the frame 32. The rotating platform 36 includes shafts 40 and 42 which are rotatably supported by the bearings 38. The shaft 40 is coupled to a rotation unit or motor 44 by a belt 45 and gears 47 to rotate the platform 36.

The platform 36 also includes a rotating mount frame 46 on which there is mounted at opposite corners thereof passive centering corners 48. Tray side "jaw" clamps 50 and retractable tabs or singulators 107 are mounted on opposite sides of the frame 46, all of which are pneumatically actuable to move between extended and retracted positions. The retractable tabs or singulators 107 may be replaced by spring-loaded tabs or singulators. The shaft 42 is hollow to permit air lines 45 to extend therethrough to actuate the clamps 50.

Referring specifically to FIGS. 1 and 5, a conveyor frame 54 extends between the legs 34 of the structure 30 and supports on top surfaces thereof spaced conveyor belts 56 and a tray hard stop 58. Between the conveyor belts 56 and the legs 34 there is disposed an elevator 60 which may be alternately raised or lowered, as indicated by arrows 62 (i.e. FIG. 5), to alternately raise or lower the lower tray 12 (substantially identical to the upper tray 12') after it is stopped by the hard stop 58 when it is raised.

Operation of the First Embodiment

Referring again to FIGS. 4 and 5, the system illustrated therein operates according to the following steps:

Component filled tray 12 reaches hard stop 58;

Tray 12' is held in place by tabs (singulators) 107 in slot or notch area 108;

Elevator 60 has passive guides to hold tray 12 in place;

Elevator 60 raises component-filled lower tray 12 to mate with upper tray 12', being guided by passive centering corners 48;

Side clamps 50 come in and clamps bottom tray 12 to top tray 12';

Elevator 60 lowers to conveyor 54 level;

Rotating mount frame 36 rotates 180°;

Elevator 60 rises to the bottom of lower tray 12';

Side clamps 50 retract and un-clamp trays 12 and 12';

Elevator 60 lowers inverted tray 12' to conveyor 54;

Tray 12' is conveyed out to next process. The following steps can be performed during this tray conveyance:

Side clamps 50 come back into place but do not perform full clamping operation (there is not bottom tray to clamp);

Tabs (singulators) 107 are retracted from slot area 108 in tray 12 allowing the tray to fall to the lower clamp arm;

Tabs (singulators) 107 are pushed back out to the slot area 108 above tray 12;

Rotating mount frame 36 rotates 180 degrees;

Side clamps 50 un-clamp tray 12;

Conveyor 54 can now move tray 12' to process 26'; and

Next tray on conveyor 54 can now be brought into position to elevate and repeat cycle.

Figure 8:
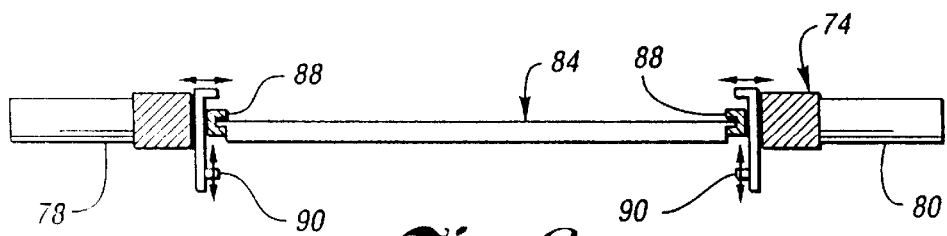
FIG. 8 is a side elevational view of the rotating mechanism of FIGS. 6 and 7 with a tray held thereby.

Referring now to FIGS. 6–8, there is illustrated a second embodiment of the system for carrying out the method of the present invention.

The system includes a fixed mounting frame, generally indicated at 70, which is preferably mounted to a main conveyor mounting platform (not shown). The mounting frame 70 includes a vertical mount platform, generally indicated at 72, which rotatably supports a main rotating mount platform, generally indicated at 74, by means of rotation bearings 76. The rotating platform 74 includes rotation guide shafts 78 and 80, respectively, which are rotatably mounted within the rotation bearings 76. The guide shaft 78 is coupled to a rotating device such as a motor 82.

The mount frame 74 supports an upper tray 84 at pneumatically-operated corner centering devices 86, tray end captivators 88, and tray end clamps 90. In this fashion, the tray 84 may be rotated in much the same fashion as the tray 24 of the first embodiment was rotated. The guide shaft 80 is hollow to receive and retain air lines (not shown) therein.

The mount platform 72 may be alternately raised or lowered relative to the mounting frame 70 by a motor 92 mounted on a mounting bracket 94 secured at the top of the mounting frame 70. The motor 92, when energized, rotates a lead screw 96 which, in turn, is threadedly secured within a fixed lead screw nut 98 which, in turn, is mounted to a linear slide unit 100 on which the mount platform 72 is secured.

As also illustrated in FIG. 7, a conveyor frame 102 supports conveyor belts 104 thereon to receive and move a second tray 106 populated with parts into the flip station.

Operation of the Second Embodiment

The second embodiment of the system of the present invention, as illustrated in FIGS. 6–8, operates according to the following steps:

Component filled tray 106 reaches hard stop (not shown);

Rotating mount frame 74 lowers empty tray 84 to just before mate position; Centering corners 86 move from tray 84;

Centering corners 86 move to trays 84 and 106; Side clamps 90 move to trays 84 and 106;

Rotating mount frame 74 lowers to conveyor 102; Tray end captivators 88 move from upper tray 84;

End clamps 90 clamp trays 84 and 106; Tray end captivators 88 move to lower tray 88;

Rotating mount frame 74 rises to rotate level;

Rotating mount frame 74 rotates 180 degrees;

Rotating mount frame 74 lowers to conveyor 102; Side clamps 90 un-clamp trays 84 and 106;

Side clamps 90 move from trays 84 and 106;

Rotating mount frame 74 rises to rotate level;

Rotating mount frame 74 rotates 180 degrees;

Conveyor 102 can now move tray to process 26; and

Next tray on conveyor 102 can now be brought into position to elevate.

A third embodiment of the system of the present invention is also provided and is a combination of the first two embodiments. In particular, the rotator unit of the third embodiment is substantially the same as the rotator unit of the first embodiment whereas the mounting unit is substantially the same as the mounting unit of the second embodiment. The third embodiment incorporates the same features as the second embodiment with the addition of side clamping and a standard elevator and has a reduced cycle time. The system of the third embodiment operates according to the following method steps:

Operation of the Third Embodiment

Component filled tray reaches hard stop;

Elevator raises component filled tray to tray meeting point; Rotating mount frame 36 lowers empty tray to just before mate; Centering corners 48 move from tray;

Centering corners 48 move toward upper and lower trays 12' and 12, respectively;

Elevator rises to a tray thickness beyond mate position;

Side clamps 50 move toward trays 12 and 12' and clamp trays 12 and 12';

Elevator lowers to conveyor level; Rotating mount frame 36 rises to rotate level;

Rotating mount frame 36 rotates 180 degrees;

Elevator rises to tray meeting point; Rotating mount frame 36 brings lower tray to elevator surface; Side clamps 50 un-clamp trays;

Side clamps 50 move from trays;

Elevator lowers inverted tray to conveyor; Rotator rises to rotate level;

Rotating mount frame 36 rotates 180 degrees;

Conveyor can now move tray to next process;

Next tray on conveyor can now be brought into position to elevate.

While the best mode for carrying out the invention has been described in detail, those familiar with the art to which this invention relates will recognize various alternative designs and embodiments for practicing the invention as defined by the following claims.

What is claimed is:

1. A method for flipping a tray of electronic devices, the method comprising the steps of:

receiving at a flip station a first tray, which holds a plurality of electronic devices, from a first part processing station;

a second tray being positioned in said flip station;

joining the second tray with the first tray so that the first and second trays mate without the second tray engaging the electronic devices;

inverting the mated first and second trays together so that the electronic devices are also inverted and held in the second tray so that the electronic devices are movable in the second tray between the mated first and second trays; and separating the mated first and second trays;

transferring the second tray which now holds the plurality of electronic devices from the flip station to a second electronic device processing station and leaving the first tray in the flipping station to function as the second tray when a subsequent first tray holding a plurality of electronic devices is received in the flipping station;

means for transferring the second tray which holds the plurality of parts from the flip station; and said trays moving through the flip station in a one-way direction.

2. The method as claimed in claim 1 further comprising the step of clamping the mated first and second trays together.

3. The method as claimed in claim 2 further comprising the step of unclamping the clamped first and second trays.

4. The method as claimed in claim 1 wherein the electronic devices are integrated circuit packages and the first and second trays are flippable storage trays, each of the trays having an upper surface which forms a grid of storage compartments and each of the storage compartments being adapted to hold a single integrated circuit package.

5. The method of claim 4 further comprising the step of vibrating the integrated circuit packages so that each integrated circuit package is properly positioned within its corresponding storage compartment after the step of inverting.

6. The method of claim 1 wherein the step of inverting includes the step of rotating the mated first and second trays through an angle of approximately 180°.

7. A system for flipping a tray of electronic devices, the system comprising:

a flip station for receiving a first tray, which holds a plurality of electronic devices from a first part processing station;

means for supporting a second tray in the flip station;

means for joining the second tray with the first tray so that the first and second trays mate without the second tray engaging the electronic devices;

means for inverting the mated first and second trays together so that the electronic devices are also inverted and held in the second tray so that the electronic devices are movable in the second tray between the mated first and second trays, the means for joining separating the mated first and second trays after the electronic devices are inverted, means for transferring the second tray which now holds the plurality of electronic devices from the flip station to a second electronic device processing station;

means for positioning the now empty first tray in the position previously occupied by the second tray so that the first tray becomes the second tray when a subsequent first tray holding a plurality of electronic devices is received in the flip station;

means for transferring the second tray which holds the plurality of parts from the flip station; and said trays moving through the flip station in a one-way direction.

8. The system as claimed in claim 7 further comprising means for clamping the mated first and second trays together and thereafter unclamping the clamped first and second trays.

9. The system as claimed in claim 7 wherein the electronic devices are integrated circuit packages and the first and second trays are flippable storage trays, each of the trays having an upper surface which forms a grid of storage compartments and each of the storage compartments being adapted to hold a single integrated circuit package.

10. The system of claim 9 further comprising means for vibrating the integrated circuit packages so that each integrated circuit package is properly positioned within its corresponding storage compartment after the parts are inverted.

11. The system of claim 7 wherein the means for inverting includes a motor for rotating the mated first and second trays through an angle of approximately 180°.

* * * * *

UNITED STATES PATENT AND TRADEMARK OFFICE
CERTIFICATE OF CORRECTION

PATENT NO : 6,139,243
DATED : October 31, 2000
INVENTOR(S): Robert L. Jackson and Russell E. Dudley It is certified that error appears in the above-identified patent and that said Letters Patent are hereby corrected as shown below:

On the face of the patent at [73], delete "Systemation Engineering, New Berlin, Wis., and insert --General Scanning, Inc., Simi Valley, CA--

Signed and Sealed this

First Day of May, 2001

Attest:

NICHOLAS P. GODICI

*Attesting Officer*    *Acting Director of the United States Patent and Trademark Office*